(12) United States Patent
Matsuda et al.

(10) Patent No.: US 7,588,799 B2
(45) Date of Patent: Sep. 15, 2009

(54) METAL FILM PRODUCTION APPARATUS

(75) Inventors: Ryuichi Matsuda, Takasago (JP); Naoki Yahata, Takasago (JP); Hitoshi Sakamoto, Yokohama (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 67 days.

(21) Appl. No.: 11/319,458

(22) Filed: Dec. 29, 2005

(65) Prior Publication Data

US 2006/0110535 A1    May 25, 2006

Related U.S. Application Data

(62) Division of application No. 10/277,207, filed on Oct. 22, 2002, now abandoned.

(30) Foreign Application Priority Data

Nov. 14, 2001    (JP) .............................. 2001-348315

(51) Int. Cl.
*C23C 16/00*    (2006.01)
*H01L 21/31*    (2006.01)
(52) U.S. Cl. ................. 427/250; 118/723 AN; 438/758
(58) Field of Classification Search .................. None
See application file for complete search history.

(56) References Cited

U.S. PATENT DOCUMENTS 5,529,657 A    6/1996    Ishii
6,040,248 A    3/2000    Chen et al.
6,280,563 B1    8/2001    Baldwin, Jr. et al.
6,308,654 B1    10/2001    Schneider et al.
6,656,540 B2 *    12/2003    Sakamoto et al. ........... 427/564

FOREIGN PATENT DOCUMENTS

EP    0322466 A1    7/1989
EP    1033743 A2    9/2000
WO    WO01/73159    * 10/2001

* cited by examiner

*Primary Examiner*—Allan Olsen
(74) *Attorney, Agent, or Firm*—Fitzpatrick, Cella, Harper & Scinto

(57) ABSTRACT

A source gas is supplied into a chamber through a nozzle, and electromagnetic waves are thrown from a plasma antenna into the chamber. The resulting $Cl_2$ gas plasma causes an etching reaction to a plurality of copper protrusions, which are arranged between a substrate and a ceiling member in a discontinuous state relative to the flowing direction of electricity in the plasma antenna, to form a precursor ($Cu_xCl_y$). The precursor ($Cu_xCl_y$) transported toward the substrate controlled to a lower temperature than the temperature of an etched member is converted into only Cu ions by a reduction reaction, and directed at the substrate to form a thin Cu film on the surface of the substrate. The speed of film formation is fast, the cost is markedly decreased, and the resulting thin Cu film is of high quality.

5 Claims, 8 Drawing Sheets

METAL FILM PRODUCTION APPARATUS

CROSS-REFERENCE TO RELATED APPLICATIONS

This application is a Divisional of application Ser. No. 10/277,207, filed on Oct. 22, 2002, now abandoned the entire contents of which are hereby incorporated by reference and for which priority is claimed under 35 U.S.C. § 120.

BACKGROUND OF THE INVENTION

1. Field of the Invention

This invention relates to a metal film production apparatus and a metal film production method of producing a metal film on the surface of a substrate by a vapor phase growth method.

2. Description of Related Art

In preparing a metal film, such as a thin film of copper, by the vapor phase growth method, it has been common practice to use an organometallic complex of a liquid, for example, copper-hexafluoroacetylacetonato-trimethylvinylsilane, as a starting material, dissolve the solid starting material in a solvent, and vaporize the solution by use of a thermal reaction to form a film on a substrate.

With the above-mentioned conventional technique, it has been difficult to increase the speed of film formation, because the film is formed with the use of a thermal reaction. Moreover, the metal complex as the starting material is expensive. In addition, hexafluoroacetylacetonato and trimethylvinylsilane accompanying copper remain as impurities in the thin film of copper, making it difficult to improve the quality of the film.

SUMMARY OF THE INVENTION

The present invention has been accomplished in light of the circumstances described above. The present invention provides a metal film production apparatus and a metal film production method which have a high film formation speed, which can use an inexpensive starting material, and which are free from impurities remaining in a film.

According to an aspect of the present invention, there is provided a metal film production apparatus, comprising, a chamber accommodating a substrate and having an upper portion open; source gas supply means for supplying a source gas containing halogen into the chamber; a ceiling member made of an insulating material for closing an opening of the upper portion of the chamber; an antenna member provided outwardly of the ceiling member and adapted to convert an atmosphere within the chamber into a plasma by supply of power; an etched member made of a metal and comprising a plurality of segments which are arranged between the substrate and the ceiling member in a discontinuous state relative to a flowing direction of electricity in the antenna member; plasma generation means which supplies power to the antenna member to generate on a substrate side of the etched member a flow of electricity in the same direction as the flowing direction of electricity in the antenna member, thereby converting the atmosphere within the chamber into a plasma and generating a source gas plasma so that the etched member is etched with the source gas plasma to form a precursor of a metal component contained in the etched member and the source gas; and temperature control means for controlling a temperature of the substrate to be lower than a temperature of the etched member to deposit the metal component of the precursor on the substrate as a film.

Thus, the invention can provide a metal film production apparatus which has a high film formation speed, which can use an inexpensive starting material, and which can form a metal film free from impurities remaining therein. Furthermore, an induced current occurring in the etched member flows in the same direction as the direction of flow of electricity in the antenna member when viewed from the substrate. Even though the etched member, an electric conductor, exists opposite the antenna member, electromagnetic waves are reliably thrown from the antenna member into the chamber. Consequently, the source gas plasma can be stably generated, with the etched member being held between the antenna member and the substrate.

According to another aspect of the present invention, there is provided a metal film production apparatus, comprising, a cylindrical chamber accommodating a substrate and open at one end; a disk-shaped ceiling member made of an insulating material for closing an opening of the chamber; source gas supply means for supplying a source gas containing a halogen into the chamber; an antenna member of a planar ring shape provided outwardly of the ceiling member and adapted to convert an atmosphere within the chamber into a plasma by supply of power; an etched member made of a metal and comprising a plurality of segments which are arranged in a circumferential direction of the chamber and extend in a diametrical direction of the chamber between the substrate and the ceiling member, and which are in a discontinuous state relative to a flowing direction of electricity in the antenna member; plasma generation means which supplies power to the antenna member to generate on a substrate side of the etched member a flow of electricity in the same direction as the flowing direction of electricity in the antenna member, thereby converting the atmosphere within the chamber into a plasma and generating a source gas plasma so that the etched member is etched with the source gas plasma to form a precursor of a metal component contained in the etched member and the source gas; and temperature control means for controlling a temperature of the substrate to be lower than a temperature of the etched member to deposit the metal component of the precursor on the substrate as a film.

Thus, the invention can provide a metal film production apparatus which has a high film formation speed, which can use an inexpensive starting material, and which can form a metal film free from impurities remaining therein. Furthermore, an induced current occurring in the etched member flows in the same direction as the direction of flow of electricity in the planar ring-shaped antenna member when viewed from the substrate. Even though the etched member, an electric conductor, exists opposite the planar ring-shaped antenna member, electromagnetic waves are reliably thrown from the antenna member into the chamber. Consequently, the source gas plasma can be stably generated, with the etched member being held between the antenna member and the substrate.

According to still another aspect of the present invention, there is provided a metal film production apparatus, comprising a cylindrical chamber accommodating a substrate and open at one end; an outwardly curved convex ceiling member made of an insulating material for closing an opening of the chamber; source gas supply means for supplying a source gas containing a halogen into the chamber; an antenna member of a conical ring shape provided in surroundings outward of the ceiling member and adapted to convert an atmosphere within the chamber into a plasma by supply of power; an etched member made of a metal and comprising a plurality of segments which are arranged in a circumferential direction of the chamber and extend in a diametrical direction of the chamber between the substrate and the ceiling member, and which are in a discontinuous state relative to a flowing direction of electricity in the antenna member; plasma generation means which supplies power to the antenna member to generate on a substrate side of the etched member a flow of electricity in the same direction as the flowing direction of electricity in the antenna member, thereby converting the atmosphere within the chamber into a plasma and generating a source gas plasma so that the etched member is etched with the source gas plasma to form a precursor of a metal component contained in the etched member and the source gas; and temperature control means for controlling a temperature of the substrate to be lower than a temperature of the etched member to deposit the metal component of the precursor on the substrate as a film.

Thus, the invention can provide a metal film production apparatus which has a high film formation speed, which can use an inexpensive starting material, and which can form a metal film free from impurities remaining therein. Furthermore, an induced current occurring in the etched member flows in the same direction as the direction of flow of electricity in the conical ring-shaped antenna member when viewed from the substrate. Even though the etched member, an electric conductor, exists opposite the conical ring-shaped antenna member, electromagnetic waves are reliably thrown from the antenna member into the chamber. Consequently, the source gas plasma can be stably generated inwardly of the etched member.

According to a further aspect of the present invention, there is provided a metal film production apparatus, comprising a cylindrical chamber accommodating a substrate and open at one end; a disk-shaped ceiling member made of an insulating material for closing an opening of the chamber; a tubular portion made of an insulating material which is provided on the one end of the chamber; source gas supply means for supplying a source gas containing a halogen into the chamber; an antenna member of a planar ring shape provided outwardly of the ceiling member and adapted to convert an atmosphere within the chamber into a plasma by supply of power; a coil antenna member of a cylindrical coil shape provided around the tubular portion and adapted to convert the atmosphere within the chamber into a plasma by supply of power; an etched member made of a metal and comprising a plurality of segments which are arranged in a circumferential direction of the chamber and extend in a diametrical direction of the chamber between the substrate and the ceiling member, and which are in a discontinuous state relative to a flowing direction of electricity in the antenna member and the coil antenna member; plasma generation means which supplies power to the antenna member and the coil antenna member to generate on a side of the etched member opposite to the antenna member a flow of electricity in the same direction as the flowing direction of electricity in the antenna member, thereby converting the atmosphere within the chamber into a plasma and generating a source gas plasma so that the etched member is etched with the source gas plasma to form a precursor of a metal component contained in the etched member and the source gas; and temperature control means for controlling a temperature of the substrate to be lower than a temperature of the etched member to deposit the metal component of the precursor on the substrate as a film.

Thus, the invention can provide a metal film production apparatus which has a high film formation speed, which can use an inexpensive starting material, and which can form a metal film free from impurities remaining therein. Furthermore, an induced current occurring in the etched member flows in the same direction as the direction of flow of electricity in the planar ring-shaped antenna member and the coil antenna member when viewed from the substrate. Even though the etched member, an electric conductor, exists opposite the planar ring-shaped antenna member and the coil antenna member, electromagnetic waves are reliably thrown from the antenna members into the chamber. Consequently, the source gas plasma can be stably generated inwardly of the etched member.

The metal film production apparatus may further comprise same potential maintaining means for connecting the plurality of segments of the etched member electrically to impart the same potential thereto. In the metal film production apparatus, the temperature control means may be means provided in the etched member and adapted to keep the etched member at a higher temperature than the temperature of the substrate. In the metal film production apparatus, the source gas supply means may be a gas supply passage and gas ejection holes provided in the etched member, the gas ejection holes communicating with the gas supply passage.

In the metal film production apparatus, a concave portion for creating a discontinuous concavity may be formed in a surface of the etched member facing the substrate. In the metal film production apparatus, the source gas containing the halogen may be a source gas containing chlorine. In the metal film production apparatus, the etched member may be made of copper to form $Cu_xCl_y$ as the precursor. In the metal film production apparatus, the etched member may be made of tantalum, tungsten or titanium which is a halide-forming metal.

According to a still further aspect of the present invention, there is provided a metal film production method involving converting an atmosphere within a chamber accommodating a substrate into a plasma by supply of power from an antenna member, comprising: disposing an etched member made of a metal and comprising a plurality of segments which are arranged in a discontinuous state relative to a flowing direction of electricity in the antenna member; supplying power to the antenna member to generate on a substrate side of the etched member a flow of electricity in the same direction as the flowing direction of electricity in the antenna member, thereby converting the atmosphere within the chamber into a plasma and generating a source gas plasma so that the etched member is etched with the source gas plasma to form a precursor of a metal component contained in the etched member and a source gas; and controlling a temperature of the substrate to be lower than a temperature of the etched member to deposit the metal component of the precursor on the substrate as a film.

Thus, the invention can provide a metal film production method which has a high film formation speed, which can use an inexpensive starting material, and which can form a metal film free from impurities remaining therein. Furthermore, an induced current occurring in the etched member flows in the same direction as the direction of flow of electricity in the antenna member when viewed from the substrate. Even though the etched member, an electric conductor, exists opposite the antenna member, electromagnetic waves are reliably thrown from the antenna member into the chamber. Consequently, the source gas plasma can be stably generated, with the etched member being held between the antenna member and the substrate.

In the metal film production method, the source gas containing the halogen may be a source gas containing chlorine. The etched member may be made of copper to form $Cu_xCl_y$ as the precursor. The etched member may be made of tantalum, tungsten or titanium which is a halide-forming metal.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
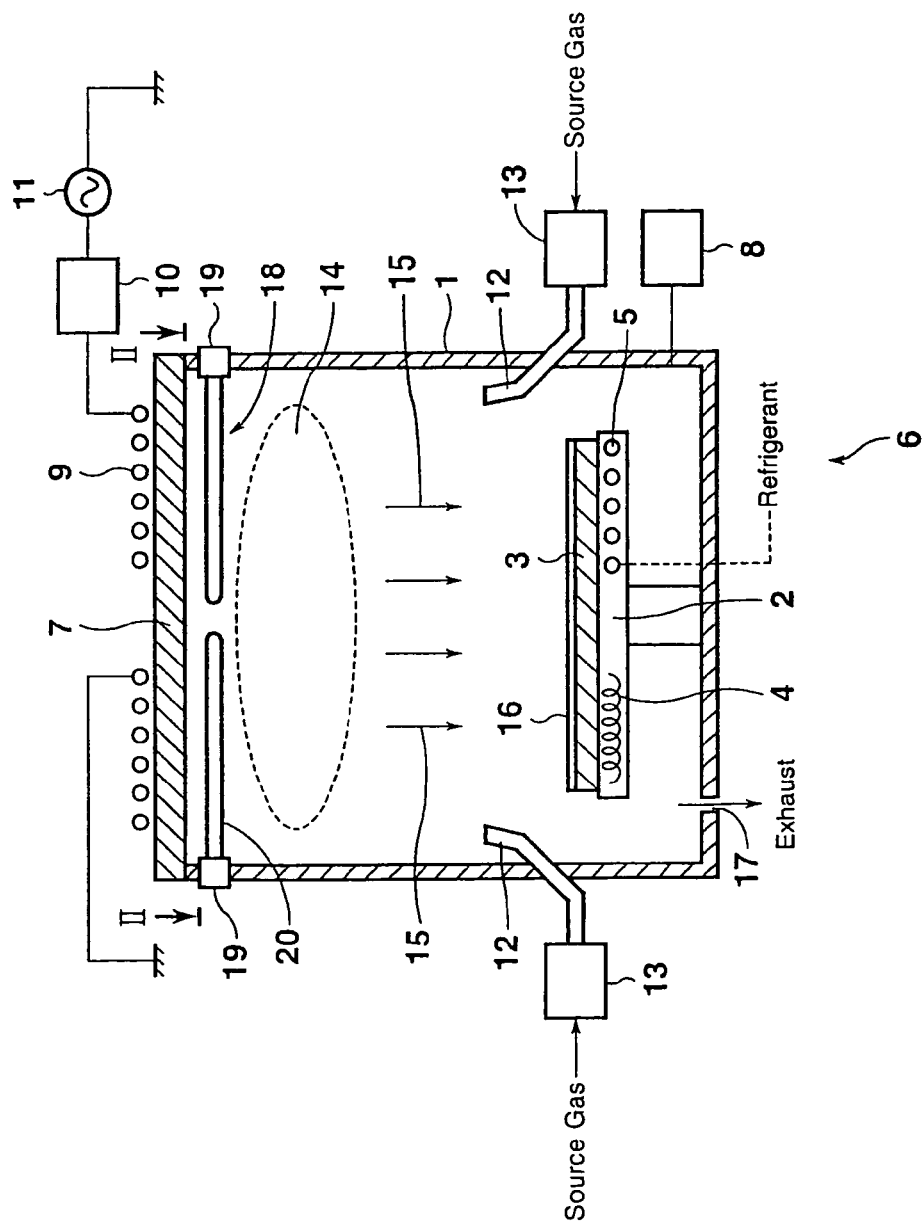
FIG. 1 is a schematic side view of a metal film production apparatus for performing a metal film production method according to a first embodiment of the present invention.
Figure 2:
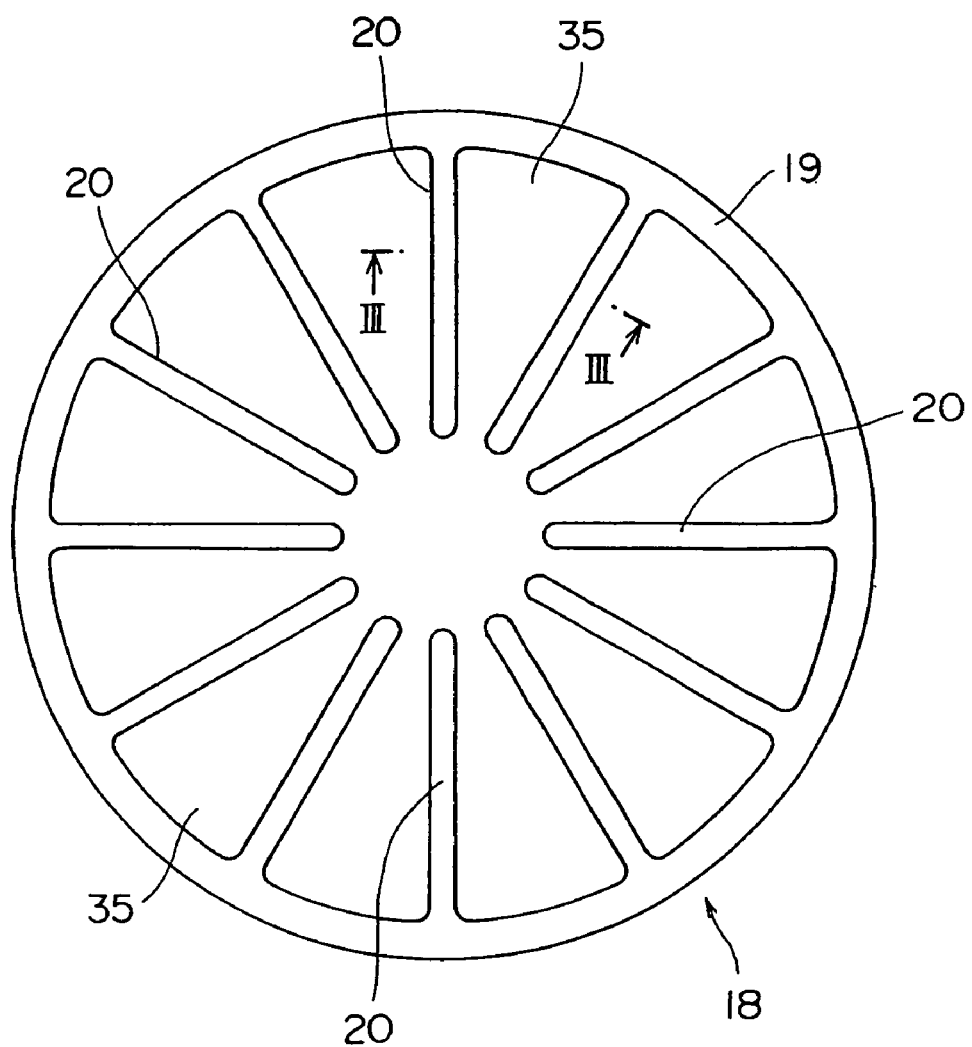
FIG. 2 is a sectional view taken on line II-II of FIG. 1.
Figure 3:
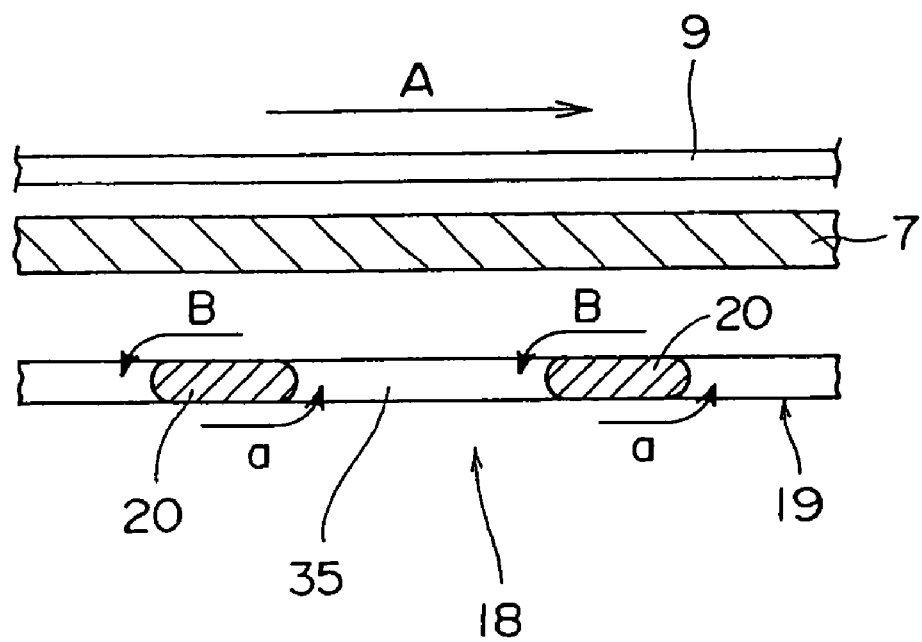
FIG. 3 is a sectional view taken on line III-III of FIG. 2.
Figure 4:
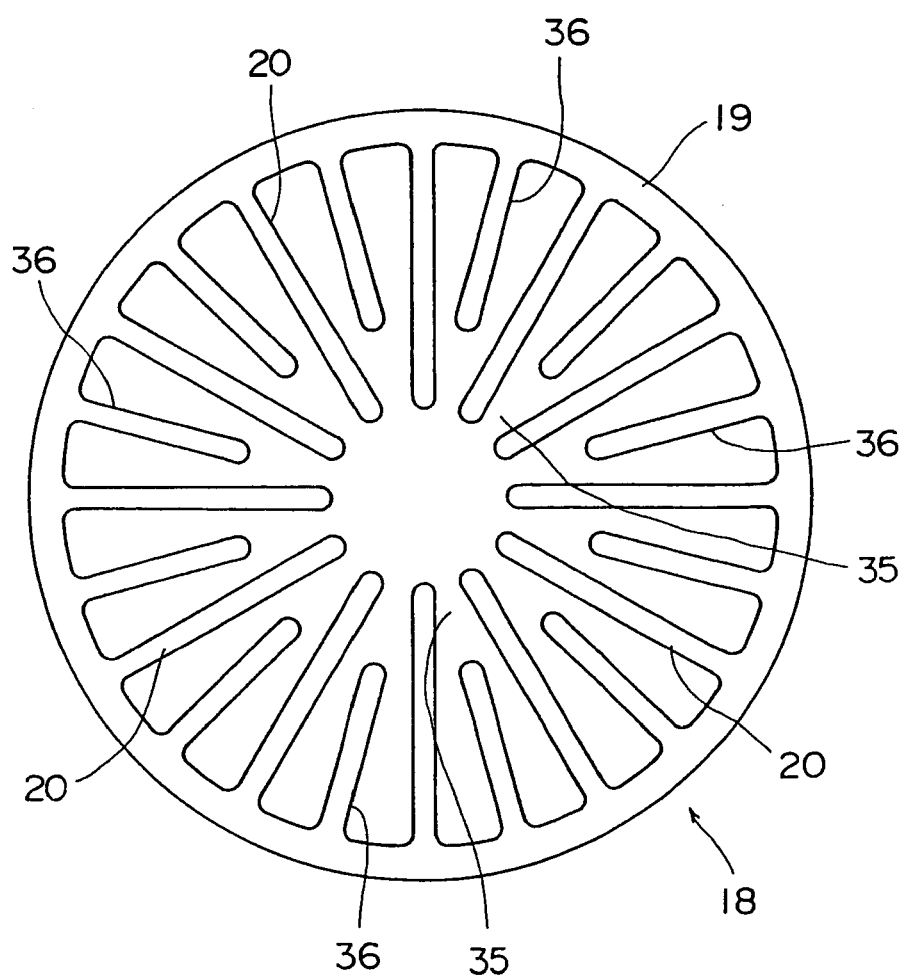
FIG. 4 is a plan view showing another embodiment of an etched member.

The first embodiment of the metal film production apparatus and metal film production method of the present invention will be described with reference to FIGS. 1 to 3. FIG. 1 is a schematic side view of the metal film production apparatus for performing the metal film production method according to the first embodiment of the present invention. FIG. 2 is a sectional view taken on line II-II of FIG. 1. FIG. 3 is a sectional view taken on line III-III of FIG. 2. FIG. 4 is a plan view showing another embodiment of an etched member.

As shown in the drawings, a support platform 2 is provided near the bottom of a cylindrical chamber 1 made of a metal (e.g., aluminum), and a substrate 3 is placed on the support platform 2. Temperature control means 6 equipped with a heater 4 and refrigerant flow-through means 5 is provided in the support platform 2 so that the support platform 2 is controlled to a predetermined temperature (for example, a temperature at which the substrate 3 is maintained at 100 to 200° C.) by the temperature control means 6.

An upper surface of the chamber 1 is an opening, which is closed with a disk-shaped ceiling board 7, a ceiling member made of an insulating material (for example, a ceramic). The interior of the chamber 1 closed by the ceiling board 7 is maintained at a predetermined pressure by a vacuum device 8. A nozzle 12 for supplying a source gas (a $Cl_2$ gas diluted with He or Ar to a chlorine concentration of $\leqq 50\%$, preferably about 10%) containing chlorine as a halogen to the interior of the chamber 1 is connected to a cylindrical portion of the chamber 1 above the support platform 2. The nozzle 12 is open toward the ceiling board 7, and is fed with the source gas via a flow controller 13. Fluorine (F), bromine (Br) or iodine (I) can also be applied as the halogen to be incorporated into the source gas.

A plurality of the nozzles 12 can be provided in a circumferential direction such that the nozzles 12 are open in two or more different directions in the circumferential direction. By choosing the nozzles 12 different in the opening direction according to situations, the status of supply of the source gas (the status of generation of a plasma) can be controlled. The locations of the nozzles 12 are not limited to the illustrated embodiment; the nozzles 12 can be provided in a horizontal direction in an upper portion of the chamber 1, or can be provided in two stages, i.e., in an upper portion and a lower portion of the chamber 1.

An etched member 18 made of a metal (Cu) is interposed between the opening at the upper surface of the chamber 1 and the ceiling board 7. As shown in FIGS. 1 and 2, the etched member 18 is provided with a ring portion 19 fitted to the opening at the upper surface of the chamber 1. A plurality of (12 in the illustrated embodiment) protrusions 20, which extend close to the center in the diametrical direction of the chamber 1 and have the same width, are provided in the circumferential direction on the inner periphery of the ring portion 19. The protrusions 20 are integrally or removably attached to the ring portion 19. Notches (spaces) 35 formed between the protrusions 20 are present between the ceiling board 7 and the interior of the chamber 1. The ring portion 19 is earthed, and the plural protrusions 20 are electrically connected together and maintained at the same potential (same potential maintaining means).

As shown in FIG. 4, second protrusions 36 shorter in the diametrical direction than the protrusions 20 can be arranged between the protrusions 20. Moreover, short protrusions can be arranged between the protrusion 20 and the second protrusion 36. By so doing, the area of copper, an object to be etched, can be secured, with an induced current being suppressed.

A plasma antenna 9, as an antenna member for converting the atmosphere inside the chamber 1 into a plasma, is provided above the ceiling board 7. The plasma antenna 9 is formed in a planar ring shape parallel to the surface of the ceiling board 7. A matching instrument 10 and a power source 11, as plasma generation means, are connected to the plasma antenna 9 to supply power. The etched member 18 has the plurality of protrusions 20 provided in the circumferential direction on the inner periphery of the ring portion 19, and includes the notches (spaces) 35 formed between the protrusions 20. Thus, the protrusions 20 are arranged between the substrate 3 and the ceiling board 7 in a discontinuous state relative to the flowing direction of electricity in the plasma antenna 9.

With the above-described metal film production apparatus, the source gas is supplied through the nozzles 12 to the interior of the chamber 1, and electromagnetic waves are shot from the plasma antenna 9 into the chamber 1. As a result, the $Cl_2$ gas is ionized to generate a $Cl_2$ gas plasma (source gas plasma) 14. The etched member 18, an electric conductor, is present below the plasma antenna 9. However, the $Cl_2$ gas plasma 14 occurs stably between the etched member 18 and the substrate 3, namely, below the etched member 18, under the following action:

The action by which the $Cl_2$ gas plasma 14 is generated below the etched member 18 will be described. As shown in FIG. 3, a flow A of electricity in the plasma antenna 9 of the planar ring shape crosses the protrusions 20. At this time, an induced current B occurs on the surface of the protrusion 20 opposed to the plasma antenna 9. Since the notches (spaces) 35 are present in the etched member 18, the induced current B flows onto the lower surface of each protrusion 20, forming a flow a in the same direction as the flow A of electricity in the plasma antenna 9 (Faraday shield).

When the etched member 18 is viewed from the substrate 3, therefore, there is no flow in a direction in which the flow A of electricity in the plasma antenna 9 is canceled out. Furthermore, the ring portion 19 is earthed, and the protrusions 20 are maintained at the same potential. Thus, even though the etched member 18, an electric conductor, exists, the electromagnetic wave is reliably thrown from the plasma antenna 9 into the chamber 1. Consequently, the Cl$_2$ gas plasma 14 is stably generated below the etched member 18.

It is also possible to eliminate instability of the plasma due to differences in potential not by connecting the protrusions 20 to the ring portion 19, but by controlling the supply of the source gas.

Owing to the Cl$_2$ gas plasma 14, an etching reaction occurs in the etched member 18 made of copper to form a precursor (Cu$_x$Cl$_y$) 15. At this time, the etched member 18 is maintained by the Cl$_2$ gas plasma 14 at a predetermined temperature (e.g., 200 to 400° C.) higher than the temperature of the substrate 3. The precursor (Cu$_x$Cl$_y$) 15 formed within the chamber 1 is transported toward the substrate 3 controlled to a temperature lower than the temperature of the etched member 18. The precursor (Cu$_x$Cl$_y$) 15 transported toward the substrate 3 is converted into only Cu ions by a reduction reaction, and directed at the substrate 3 to form a thin Cu film 16 on the surface of the substrate 3.

The reaction in this case can be expressed by:

$$2Cu+Cl_2 \rightarrow 2CuCl \rightarrow 2Cu\downarrow + Cl_2 \uparrow$$

The gas that has not been involved in the reaction, and the etching product are exhausted through an exhaust port 17.

The source gas has been described, with the Cl$_2$ gas diluted with, say, He or Ar taken as an example. However, the Cl$_2$ gas can be used alone, or an HCl gas can also be applied. When the HCl gas is applied, an HCl gas plasma is formed as the source gas plasma, but the precursor formed by etching of the etched member 18 is Cu$_x$Cl$_y$. Thus, the source gas may be any gas containing chlorine, and a gas mixture of an HCl gas and a Cl$_2$ gas is also usable. The material for the etched member 18 is not limited to copper (Cu), but may be a halide-forming metal, preferably, a chloride-forming metal, such as Ag, Au, Pt, Ta, Ti or W. In this case, the precursor is a halide (chloride) of Ag, Au, Pt, Ta, Ti or W, and the thin firm formed on the surface of the substrate 3 is a thin film of Ag, Au, Pt, Ta, Ti or W.

The metal film production apparatus having the above-described features uses the Cl$_2$ gas plasma (source gas plasma) 14. Thus, the efficiency of the reaction markedly increases, and the film forming speed increases. Also, since a Cl$_2$ gas is used as the source gas, the cost can be decreased sharply. Moreover, the substrate 3 is controlled to a temperature lower than the temperature of the etched member 18 with the use of the temperature control means 6. Hence, smaller amounts of impurities, such as chlorine, can be left in the thin Cu film 16, so that a high quality thin Cu film 16 can be formed.

In addition, the etched member 18 has the plurality of protrusions 20 provided in the circumferential direction on the inner periphery of the ring portion 19, and includes the notches (spaces) 35 formed between the protrusions 20. Thus, the induced currents generated in the etched member 18 flow in the same direction as the flowing direction of electricity in the plasma antenna 9, when viewed from the substrate 3. Therefore, even though the etched member 18, an electric conductor, exists below the plasma antenna 9, the electromagnetic waves are reliably thrown from the plasma antenna 9 into the chamber 1. Consequently, the Cl$_2$ gas plasma 14 can be stably generated below the etched member 18.

Many grooves or depressions may be formed in the underside of the etched member 18 (protrusion 20) to create a discontinuous concavity in the surface. By so doing, even if copper grows on the underside of the protrusion 20 from the precursor 15 formed by etching with the Cl$_2$ gas plasma 14, the copper does not grow just downward from the underside of the protrusion 20.

A portion of the chamber 1, where the substrate 3 is disposed, may be partitioned off with a partition member made of an insulator below the nozzles 12. Many holes may be punched in the partition member, and the precursor (Cu$_x$Cl$_y$) 15 formed by etching may be transported onto the substrate 3 through the resulting holes. That is, the interior of the chamber 1 can be divided into a site, where the Cl$_2$ gas plasma 14 is generated, and a site, where the substrate 3 is installed below the nozzles 12, by the partition member provided with the many holes. By so isolating the substrate 3 from the Cl$_2$ gas plasma 14, the substrate 3 is not exposed to the Cl$_2$ gas plasma 14, and thus is free from damage from the plasma.

Figure 5:
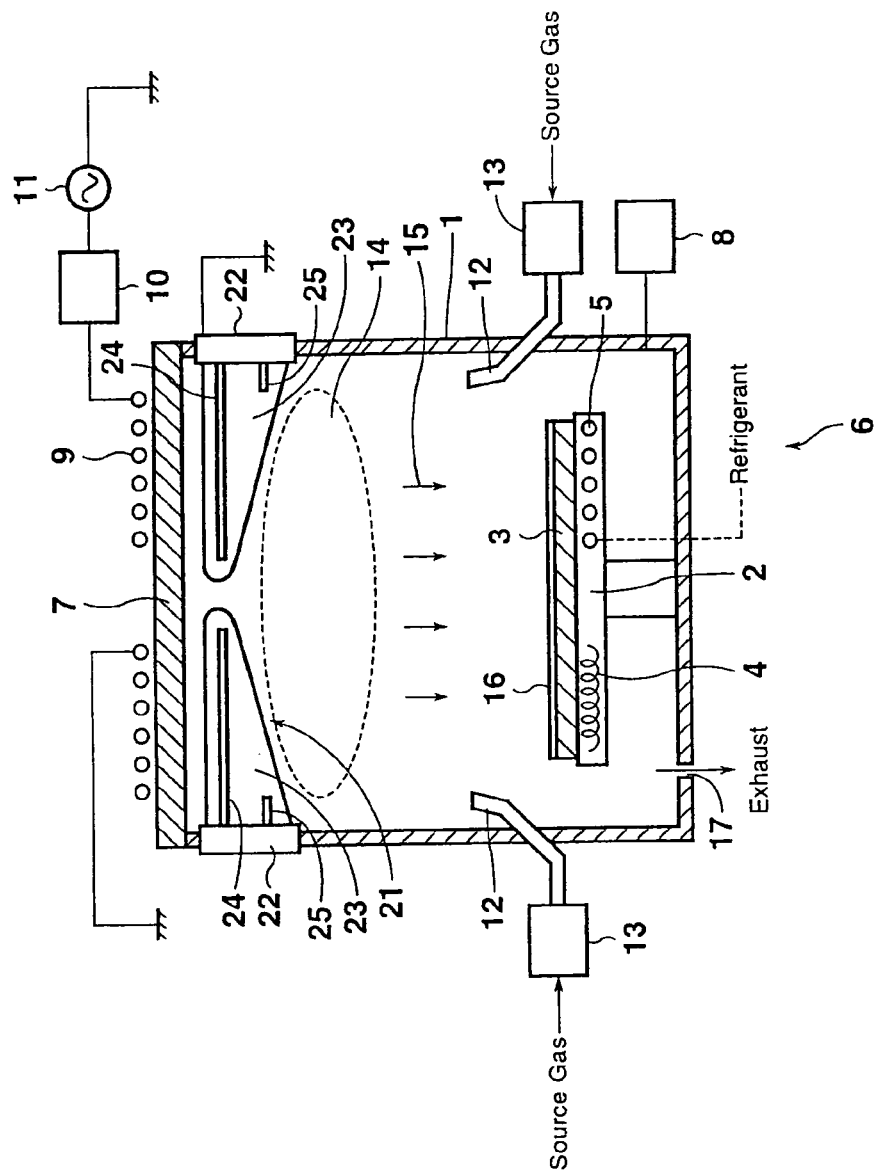
FIG. 5 is a schematic side view of a metal film production apparatus for performing a metal film production method according to a second embodiment of the present invention.

The metal film production apparatus and metal film production method according to the second embodiment of the present invention will be described with reference to FIG. 5. FIG. 5 shows a schematic side view of the metal film production apparatus for performing the metal film production method according to the second embodiment of the present invention. The same members as the members illustrated in FIG. 1 are assigned the same reference numerals, and duplicate explanations are omitted.

The metal film production apparatus according to the second embodiment shown in FIG. 5 is the metal film production apparatus shown in FIG. 1 provided with an etched member having a different shape. That is, an etched member 21 made of a metal (Cu) is held between the opening at the upper surface of the chamber 1 and the ceiling board 7. The etched member 21 has a ring portion 22 fitted to the opening at the upper surface of the chamber 1, the ring portion 22 being in the form of a short cylinder having the same diameter as the diameter of the chamber 1.

A plurality of protrusions 23, which extend close to the center in the diametrical direction of the chamber 1, have the same width, and have a lower surface inclined upward and a thickness progressively decreased in an upward direction, are provided in the circumferential direction on the inner periphery of the ring portion 22. For example, the thickness of the front end of the protrusion 23 is set at about a fourth to fifth of the thickness of the ring portion 22. The ring portion 22 is earthed, and the plural protrusions 23 are electrically connected together and maintained at the same potential (same potential maintaining means). Notches (spaces) are present between the protrusions 23 in the same manner as in the first embodiment.

A sheath heater 24 is provided in the protrusion 23, and the temperature of the protrusion 23 is controlled by a thermocouple 25 (sensor) to a predetermined temperature higher than the temperature of the substrate 3 (the action of temperature control means). The sheath heater 24 and the thermocouple 25 may be provided in all of the protrusions 23, or may be provided in the protrusions 23 arranged alternately. Further, the sheath heater 24 and the thermocouple 25 can be provided in the ring portion 22.

With the above-described metal film production apparatus, a source gas is supplied through the nozzles 12 to the interior of the chamber 1, and electromagnetic waves are shot from the plasma antenna 9 into the chamber 1. As a result, the Cl$_2$ gas is ionized to generate a Cl$_2$ gas plasma (source gas plasma) 14. The etched member 21, an electric conductor, is present below the plasma antenna 9. However, since the notches (space) are present, there is no flow in a direction in which the flow of electricity in the plasma antenna 9 is canceled out, when the etched member 21 is viewed from the substrate 3, as in the first embodiment. Furthermore, the ring portion 22 is earthed, and the protrusions 23 are maintained at the same potential. Thus, even though the etched member 21, an electric conductor, exists, the electromagnetic waves are reliably thrown from the plasma antenna 9 into the chamber 1. Consequently, the $Cl_2$ gas plasma 14 is stably generated below the etched member 18.

Owing to the $Cl_2$ gas plasma 14, an etching reaction occurs in the etched member 21 made of copper to form a precursor $(Cu_xCl_y)$ 15. At this time, the etched member 21 is maintained by the $Cl_2$ gas plasma 14 and the sheath heater 24 at a predetermined temperature (e.g., 200 to 400° C.) higher than the temperature of the substrate 3. The precursor $(Cu_xCl_y)$ 15 formed within the chamber 1 is transported toward the substrate 3 controlled to a temperature lower than the temperature of the etched member 21. The precursor $(Cu_xCl_y)$ 15 transported toward the substrate 3 is converted into only Cu ions by a reduction reaction, and directed at the substrate 3 to form a thin Cu film 16 on the surface of the substrate 3.

In the metal film production apparatus having the above features, the etched member 21 is controlled by the sheath heater 24 and the thermocouple 25 to a predetermined temperature higher than the temperature of the substrate 3. This control, coupled with the temperature control of the substrate 3 by the temperature control means 6, enables the temperature relationship between the etched member 21 and the substrate 3 to be controlled to temperature conditions optimal for the reduction reaction of the precursor $(Cu_xCl_y)$ 15. Moreover, the portion of the protrusion 23 beside the ring portion 22 is thick. Thus, the etching reaction can be performed efficiently by the effective use of the $Cl_2$ gas plasma 14 existent below.

Many grooves or depressions may be formed in the underside of the etched member 21 (protrusion 23) to create a discontinuous cavity in the surface. By so doing, even if copper grows on the underside of the protrusion 23 from the precursor 15 formed by etching with the $Cl_2$ gas plasma 14, the copper does not grow just downward from the underside of the protrusion 23.

Figure 6:
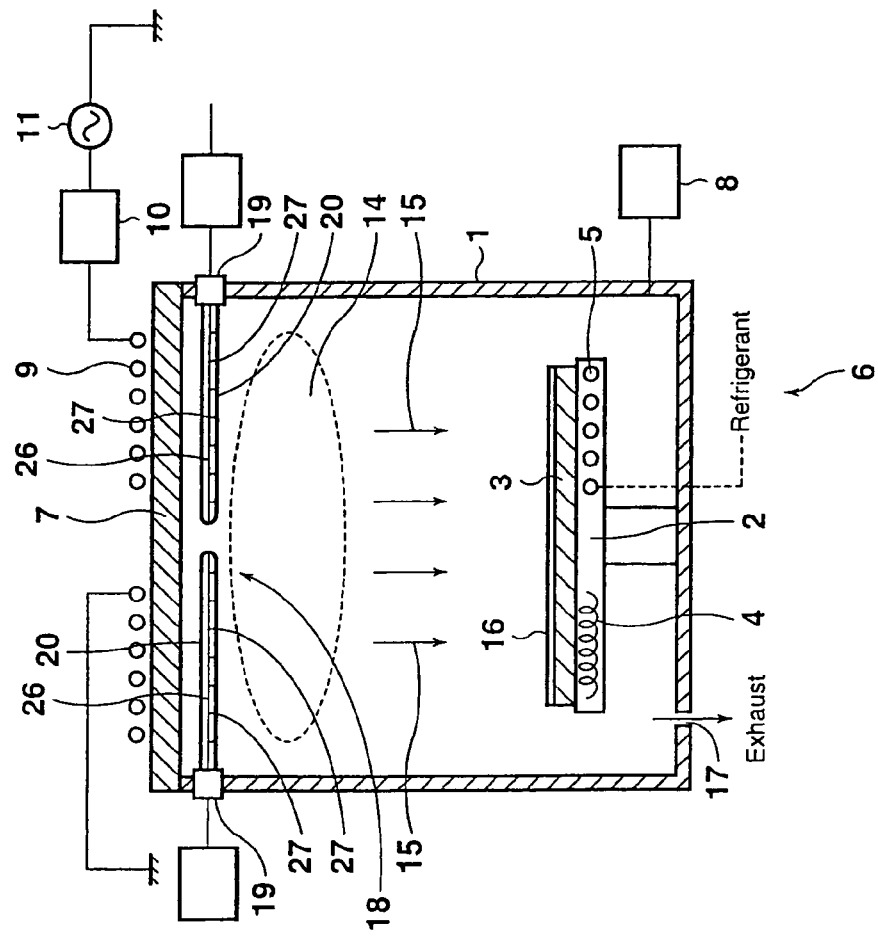
FIG. 6 is a schematic side view of a metal film production apparatus for performing a metal film production method according to a third embodiment of the present invention.

The metal film production apparatus and metal film production method according to the third embodiment of the present invention will be described with reference to FIG. 6. FIG. 6 shows a schematic side view of the metal film production apparatus for performing the metal film production method according to the third embodiment of the present invention. The same members as the members illustrated in FIG. 1 are assigned the same reference numerals, and duplicate explanations are omitted.

The metal film production apparatus according to the third embodiment shown in FIG. 6 is different from the metal film production apparatus shown in FIG. 1 in that the nozzles 12 and the flow controllers 13 at the lower portion of the chamber 1 are not provided. A gas passage 26 is formed in the center of the protrusion 20, and gas ejection holes 27 communicating with the gas passage 26 are formed at the front end of the protrusion 20 and at suitable positions in a lower area of the protrusion 20. A source gas is supplied from a flow controller 13 to the gas passage 26.

With the above-described metal film production apparatus, the source gas is supplied to the interior of the chamber 1 through the gas ejection holes 27 of the protrusions 20, and electromagnetic waves are shot from the plasma antenna 9 into the chamber 1. As a result, the $Cl_2$ gas is ionized to generate a $Cl_2$ gas plasma (source gas plasma) 14. The etched member 18, an electric conductor, is present below the plasma antenna 9. However, there is no flow in a direction in which the flow of electricity in the plasma antenna 9 is canceled out, when the etched member 18 is viewed from the substrate 3, as in the first embodiment. Furthermore, the ring portion 19 is earthed, and the protrusions 20 are maintained at the same potential. Thus, even though the etched member 18, an electric conductor, exists, the electromagnetic waves are reliably thrown from the plasma antenna 9 into the chamber 1. Consequently, the $Cl_2$ gas plasma 14 is stably generated below the etched member 18.

Owing to the $Cl_2$ gas plasma 14, an etching reaction occurs in the etched member 18 made of copper to form a precursor $(Cu_xCl_y)$ 15. At this time, the etched member 18 is maintained by the $Cl_2$ gas plasma 14 at a predetermined temperature (e.g., 200 to 400° C.) higher than the temperature of the substrate 3. The precursor $(Cu_xCl_y)$ 15 formed within the chamber 1 is transported toward the substrate 3 controlled to a temperature lower than the temperature of the etched member 18. The precursor $(Cu_xCl_y)$ 15 transported toward the substrate 3 is converted into only Cu ions by a reduction reaction, and directed at the substrate 3 to form a thin Cu film 16 on the surface of the substrate 3.

In the metal film production apparatus having the above features, the source gas is supplied to the interior of the chamber 1 through the gas ejection holes 27 of the protrusions 20. Thus, separately installed nozzles are unnecessary, and the desired amount of the source gas can be supplied to the desired site. Consequently, it becomes possible to promote stabilization of the $Cl_2$ gas plasma 14 below the etched member 18.

In addition, the etched member may comprise the protrusions 20 of the third embodiment provided with the gas passage 26 and the gas ejection holes 27, and the protrusions 23 of the second embodiment provided with the sheath heater 24 and the thermocouple 25, the protrusions 20 and the protrusions 23 being arranged alternately in the circumferential direction of the etched member. According to this configuration, it becomes possible to realize, at the same time, the optimal control of the temperature relationship between the substrate 3 and the etched member, and the promotion of stabilization of the $Cl_2$ gas plasma 14.

Figure 7:
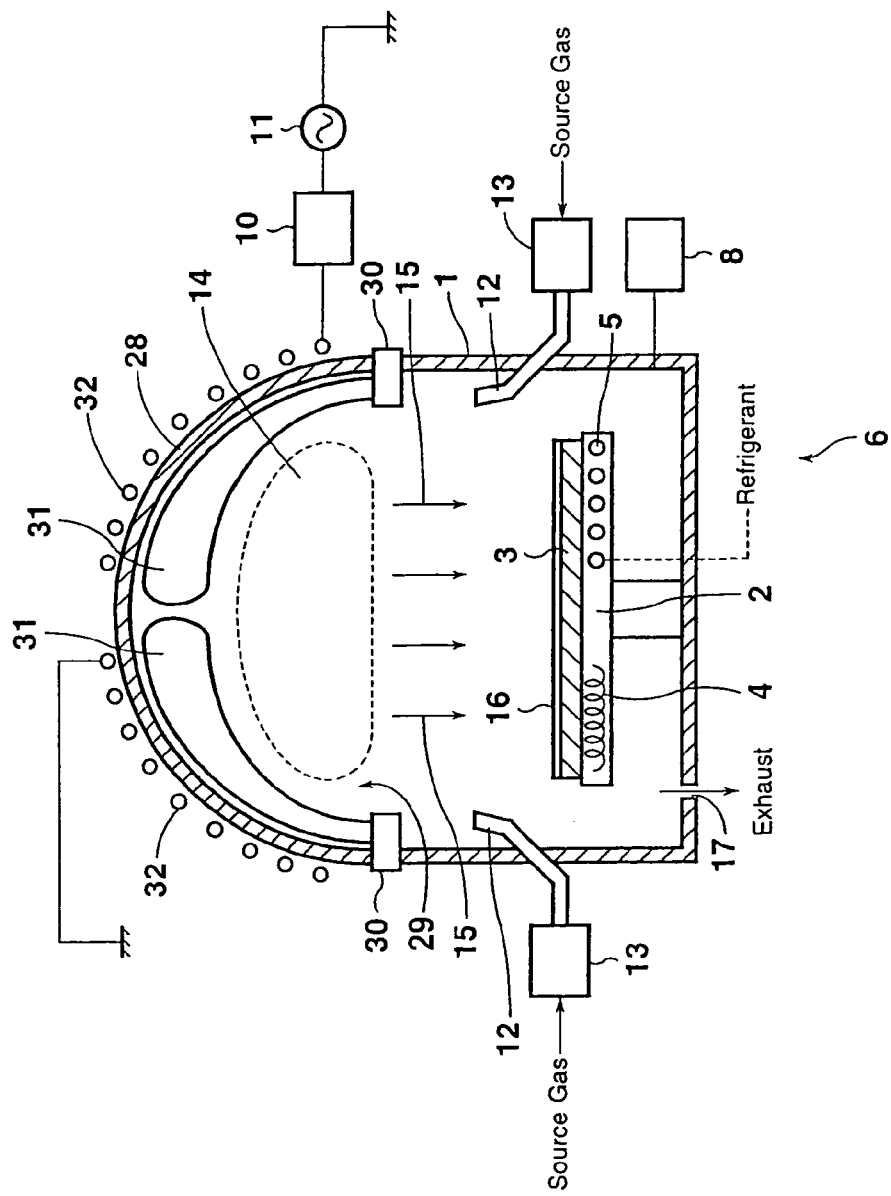
FIG. 7 is a schematic side view of a metal film production apparatus for performing a metal film production method according to a fourth embodiment of the present invention.

The metal film production apparatus and metal film production method according to the fourth embodiment of the present invention will be described with reference to FIG. 7. FIG. 7 shows a schematic side view of the metal film production apparatus for performing the metal film production method according to the fourth embodiment of the present invention. The same members as the members illustrated in FIG. 1 are assigned the same numerals, and duplicate explanations are omitted.

The metal film production apparatus according to the fourth embodiment shown in FIG. 7 is the metal film production apparatus different from the one shown in FIG. 1 in the shapes of the ceiling member, plasma antenna, and etched member. That is, a bowl-shaped (dome-shaped) ceiling member 28, which is made of an insulating material (ceramic or the like) and is convex outwardly, is fixed to an upper opening of the chamber 1.

An etched member 29 made of a metal (Cu) is held between the opening at the upper surface of the chamber 1 and the ceiling member 28. The etched member 29 has a ring portion 30 fitted on the opening at the upper surface of the chamber 1, and a plurality of protrusions 31, which extend close to the center in the diametrical direction of the chamber 1 and extend along the bowl-shaped inner surface of the ceiling member 28, are provided in the circumferential direction on the inner periphery of the ring portion 30. The ring portion 30 is earthed, and the plural protrusions 31 are electrically connected together and maintained at the same potential (same potential maintaining means).

A sheath heater 24 and a thermocouple 25, as shown in the second embodiment, or a gas passage 26 and gas ejection holes 27, as shown in the third embodiment, may be provided in the protrusion 31 of the etched member 29. Many grooves or depressions may be formed in the underside of the protrusion 31 to create a discontinuous concavity in the surface. By so doing, even if copper grows on the underside of the protrusion 31 from the precursor 15 formed by etching with the $Cl_2$ gas plasma 14, the copper does not grow just downward from the underside of the protrusion 31.

A plasma antenna 32, as an antenna member for converting the atmosphere inside the chamber 1 into a plasma, is provided in the surroundings above the ceiling member 28. The plasma antenna 32 is formed in a conical ring shape along the bowl-shaped surface of the ceiling member 28. A matching instrument 10 and a power source 11, as plasma generation means, are connected to the plasma antenna 32 to supply power. The etched member 29 has the plurality of protrusions 31 provided in the circumferential direction along the bowl-shaped surface of the ceiling member 28 on the inner periphery of the ring portion 30, and includes notches (spaces) formed between the protrusions 31. Thus, the protrusions 31 are arranged between a substrate 3 and the ceiling member 28 in a discontinuous state relative to the flowing direction of electricity in the plasma antenna 32.

With the above-described metal film production apparatus, the source gas is supplied through the nozzle 12 to the interior of the chamber 1, and electromagnetic waves are shot from the plasma antenna 32 into the chamber 1. As a result, the $Cl_2$ gas is ionized to generate a $Cl_2$ gas plasma (source gas plasma) 14. The etched member 29, an electric conductor, is present in a portion inside the chamber 1 opposed to the plasma antenna 32, with the ceiling member 28 being held between the plasma antenna 32 and the etched member 29. However, since the notches (spaces) are present, there is no flow in a direction in which the flow of electricity in the plasma antenna 32 is canceled out, when the etched member 29 is viewed from the substrate 3, as in the first embodiment. Furthermore, the ring portion 30 is earthed, and the protrusions 31 are maintained at the same potential. Thus, even though the etched member 29, an electric conductor, exists, the electromagnetic waves are reliably thrown from the plasma antenna 32 into the chamber 1. Consequently, the $Cl_2$ gas plasma 14 is stably generated inside of the etched member 29.

Owing to the $Cl_2$ gas plasma 14, an etching reaction occurs in the etched member 29 made of copper to form a precursor ($Cu_xCl_y$) 15. At this time, the etched member 29 is maintained by the $Cl_2$ gas plasma 14 at a predetermined temperature (e.g., 200 to 400° C.) higher than the temperature of the substrate 3. The precursor ($Cu_xCl_y$) 15 formed within the chamber 1 is transported toward the substrate 3 controlled to a temperature lower than the temperature of the etched member 29. The precursor ($Cu_xCl_y$) 15 transported toward the substrate 3 is converted into only Cu ions by a reduction reaction, and directed at the substrate 3 to form a thin Cu film 16 on the surface of the substrate 3.

In the metal film production apparatus having the above features, the ceiling member 28 is shaped like a bowl, and the plasma antenna 32 is shaped like a conical ring along the bowl shape of the ceiling member 28. Thus, the electromagnetic waves can be shot from around the ceiling member 28 to generate the $Cl_2$ gas plasma 14, thereby stabilizing the $Cl_2$ gas plasma 14 inwardly of the ceiling member 28. Hence, the uniformity of the $Cl_2$ gas plasma 14 inside of the chamber 1 can be achieved by the one power source.

Figure 8:
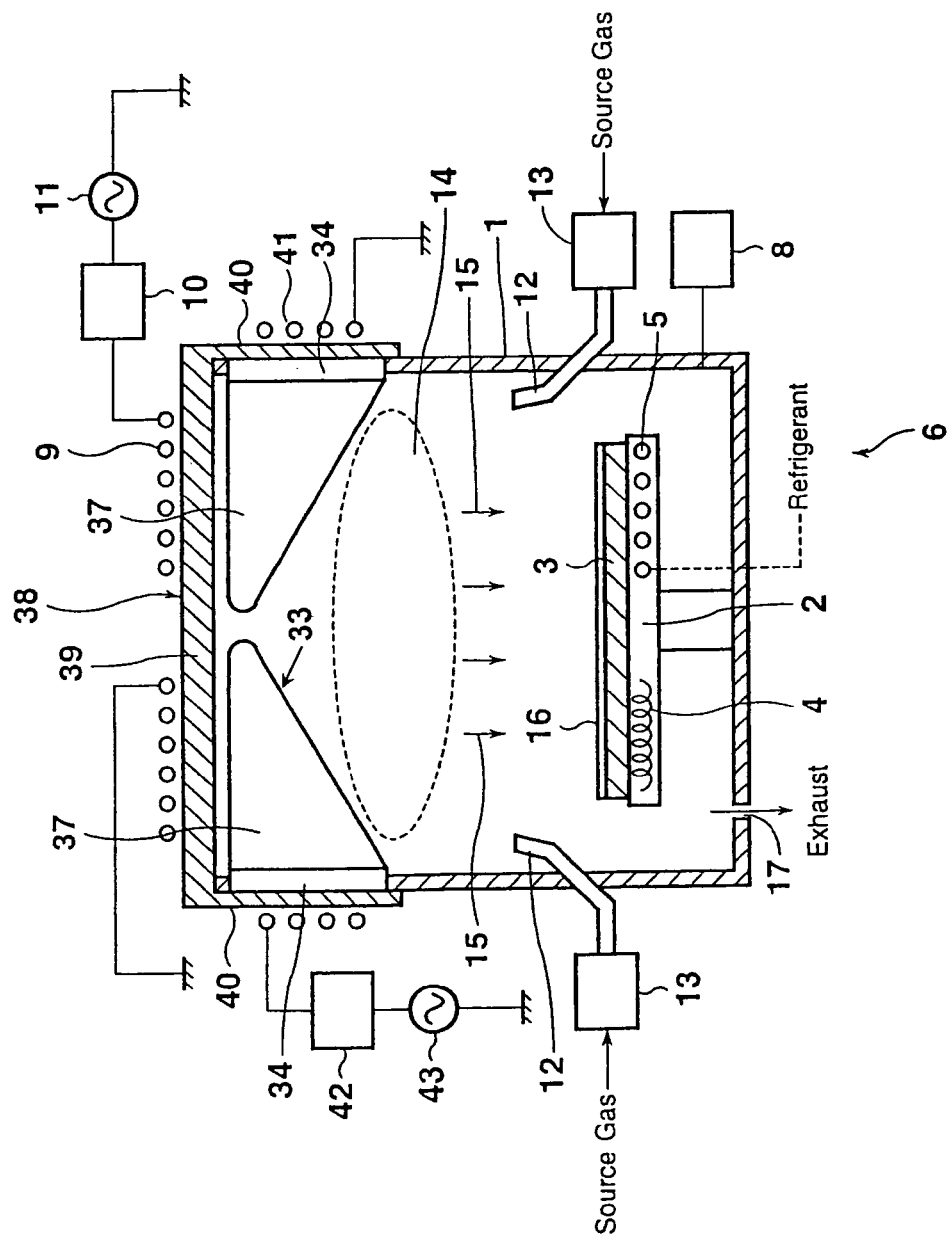
FIG. 8 is a schematic side view of a metal film production apparatus for performing a metal film production method according to a fifth embodiment of the present invention.

The metal film production apparatus and metal film production method according to the fifth embodiment of the present invention will be described with reference to FIG. 8. FIG. 8 shows a schematic side view of the metal film production apparatus for performing the metal film production method according to the fifth embodiment of the present invention. The same members as the members illustrated in FIG. 1 are assigned the same numerals, and duplicate explanations are omitted.

The metal film production apparatus according to the fifth embodiment shown in FIG. 8 is different from the metal film production apparatus shown in FIG. 1 in the shapes of the ceiling member, plasma antenna, and etched member. That is, a ceiling member 38 made of an insulating material (ceramic or the like) is fixed to an upper opening of the chamber 1. The ceiling member 38 is composed of a disk-shaped ceiling portion 39 and a tubular portion 40. The ceiling member may be composed of the ceiling portion 39 alone, and an upper cylindrical portion of the chamber 1 may be composed of an insulating material for use as the tubular portion.

An etched member 33 made of a metal (Cu) is provided between the opening at the upper surface of the chamber 1 and the ceiling member 38. The etched member 33 has a tubular ring portion 34 disposed on the inner periphery of the tubular portion 40. A plurality of protrusions 37, which extend close to the center in the diametrical direction of the chamber 1, have the same width, and have a lower surface inclined upward and a thickness progressively decreased in an upward direction, are provided in the circumferential direction on the inner periphery of the ring portion 34. The ring portion 34 is earthed, and the plural protrusions 37 are electrically connected together and maintained at the same potential (same potential maintaining means).

The sheath heater 24 and thermocouple 25, shown in the second embodiment, or the gas passage 26 and gas ejection holes 27, shown in the third embodiment, may be provided in the protrusion 37 of the etched member 33. Many grooves or depressions may be formed in the underside of the protrusion 37 to create a discontinuous concavity in the surface. By so doing, even if copper grows on the underside of the protrusion 37 from the precursor 15 formed by etching with the $Cl_2$ gas plasma 14, the copper does not grow just downward from the underside of the protrusion 37.

A plasma antenna 9, as an antenna member for converting the atmosphere inside the chamber 1 into a plasma, is provided above the ceiling portion 39 of the ceiling member 38. The plasma antenna 9 is formed in a planar ring shape parallel to the surface of the ceiling portion 39. A matching instrument 10 and a power source 11, as plasma generation means, are connected to the plasma antenna 9 to supply power. A coil antenna 41, as a coil antenna member for converting the atmosphere inside the chamber 1 into a plasma, is provided around the tubular portion 40. A second matching instrument 42 and a second power source 43, as plasma generation means, are connected to the coil antenna 41 to supply power.

The etched member 33 has the plurality of protrusions 37 provided in the circumferential direction on the inner periphery of the ring portion 34, and includes notches (spaces) formed between the protrusions 37. Thus, the protrusions 37 are arranged between a substrate 3 and the ceiling member 38 in a discontinuous state relative to the flowing direction of electricity in the plasma antenna 9 and the coil antenna 41.

With the above-described metal film production apparatus, the source gas is supplied through the nozzles 12 to the interior of the chamber 1, and electromagnetic waves are shot from the plasma antenna 9 and the coil antenna 41 into the chamber 1. As a result, the $Cl_2$ gas is ionized to generate a $Cl_2$ gas plasma (source gas plasma) 14. The etched member 33, an electric conductor, is present in a portion inside the chamber 1 opposed to the plasma antenna 9 and the coil antenna 41, with the ceiling member 38 being held between these antennas and the etched member 33. However, since the notches (spaces) are present, there is no flow in a direction in which the flows of electricity in the plasma antenna 9 and the coil antenna 41 are canceled out, when the etched member 33 is viewed from the substrate 3, as in the first embodiment. Furthermore, the ring portion 34 is earthed, and the protrusions 37 are maintained at the same potential. Thus, even though the etched member 33, an electric conductor, exists, the electromagnetic waves are reliably thrown from the plasma antenna 9 and the coil antenna 41 into the chamber 1. Consequently, the $Cl_2$ gas plasma 14 is stably generated inside of the etched member 33.

Owing to the $Cl_2$ gas plasma 14, an etching reaction occurs in the etched member 33 made of copper to form a precursor $(Cu_xCl_y)$ 15. At this time, the etched member 33 is maintained by the $Cl_2$ gas plasma 14 at a predetermined temperature (e.g., 200 to 400° C.) higher than the temperature of the substrate 3. The precursor $(Cu_xCl_y)$ 15 formed within the chamber 1 is transported toward the substrate 3 controlled to a temperature lower than the temperature of the etched member 33. The precursor $(Cu_xCl_y)$ 15 transported toward the substrate 3 is converted into only Cu ions by a reduction reaction, and directed at the substrate 3 to form a thin Cu film 16 on the surface of the substrate 3.

In the metal film production apparatus having the above features, the ceiling member 38 is composed of the ceiling portion 39 and the tubular portion 40, and the plasma antenna 9 and the coil antenna 41 are arranged outwardly of the ceiling member 38. Thus, the electromagnetic waves can be shot from around the ceiling member 38 to generate the $Cl_2$ gas plasma 14, thereby stabilizing the $Cl_2$ gas plasma 14 inwardly of the ceiling member 38. Furthermore, power is supplied individually to the plasma antenna 9 and the coil antenna 41. Hence, the state of the $Cl_2$ gas plasma 14 within the chamber 1 can be controlled to achieve the uniformity of the $Cl_2$ gas plasma 14. The plasma antenna 9 and the coil antenna 41 can be integrated to perform power supply from a single power source.

While the present invention has been described by the foregoing embodiments, it is to be understood that the invention is not limited thereby, but may be varied in many other ways. For example, the embodiments have been described, with the etched member being disposed on the ceiling side of the chamber, and the substrate being disposed on the lower side of the chamber. However, the positions of the etched member and the substrate in the vertical direction may be reversed, and in some cases, the etched member and the substrate may be arranged in the right-and-left direction.

Such variations are not to be regarded as a departure from the spirit and scope of the invention, and all such modifications as would be obvious to one skilled in the art are intended to be included within the scope of the appended claims.

What is claimed is:

1. A metal film production method involving converting an atmosphere within a chamber into a plasma by supply of power from an antenna member, comprising:
   disposing an etched member made of a metal and having a plurality of segments which are arranged in a discontinuous state relative to a flowing direction of electricity in the antenna member;
   supplying a source gas containing a halogen into the chamber, said chamber accommodating a substrate supported by a platform;
   supplying power to the antenna member to generate on a substrate side of the etched member a flow of electricity in the same direction as the flowing direction of electricity in the antenna member, thereby converting the atmosphere within the chamber into a plasma and generating a source gas plasma so that the etched member is etched with the source gas plasma to form a precursor from a metal component contained in the etched member and the halogen; and
   controlling a temperature of the platform to a predetermined temperature, such that a temperature of the substrate is controlled to be about 100 to 200° C. to be lower than a temperature of the etched member to deposit the metal component of the precursor on the substrate as a film by a reduction reaction of the halogen.

2. The metal film production method of claim 1, wherein the source gas containing the halogen is a source gas containing chlorine.

3. The metal film production method of claim 1, wherein the etched member is made of copper to form $Cu_xCl_y$ as the precursor.

4. The metal film production method of claim 1, wherein the etched member is made of tantalum, tungsten or titanium which is a halide-forming metal.

5. The metal film production method of claim 1, wherein the controlling step controls the temperature of the platform by at least one of heating the platform by a heater and cooling the platform by a refrigerant.

* * * * *